(12) United States Patent
Monro (10) Patent No.: US 7,845,571 B2
(45) Date of Patent: Dec. 7, 2010

(54) DATA COMPRESSION

(76) Inventor: Donald M. Monro, 6, The Lays, Goose Street, Beckington, Somerset BA 11 6RS (GB)

( * ) Notice: Subject to any disclaimer, the term of this patent is extended or adjusted under 35 U.S.C. 154(b) by 1117 days.

(21) Appl. No.: 11/425,138

(22) Filed: Jun. 19, 2006

(65) Prior Publication Data

US 2007/0290898 A1 Dec. 20, 2007

(51) Int. Cl.
*G06K 19/06* (2006.01)
(52) U.S. Cl. .......................... 235/494; 341/51; 341/60; 341/67; 341/83; 707/5; 707/37; 707/102
(58) Field of Classification Search ................. 235/494; 341/51, 60, 67, 83; 707/5, 37, 102
See application file for complete search history.

(56) References Cited

U.S. PATENT DOCUMENTS

| 4,168,513 | A | 9/1979 | Hains et al. |
| 4,509,038 | A | 4/1985 | Hirano |
| 4,675,809 | A | 6/1987 | Koichiro |
| 4,908,873 | A | 3/1990 | Philbert et al. |
| 5,218,435 | A | 6/1993 | Lim et al. |
| 5,315,670 | A | 5/1994 | Shapiro |
| 5,321,776 | A | 6/1994 | Shapiro |
| 5,412,741 | A | 5/1995 | Shapiro |
| 5,559,931 | A | 9/1996 | Shindou et al. |
| 5,699,121 | A | 12/1997 | Zakhor et al. |
| 5,748,786 | A | 5/1998 | Zandi et al. |
| 5,754,704 | A | 5/1998 | Barnsley et al. |
| 5,768,437 | A | 6/1998 | Monro et al. |
| 5,819,017 | A | 10/1998 | Akeley et al. |
| 5,873,076 | A | 2/1999 | Barr et al. |
| 5,956,429 | A | 9/1999 | Burns |
| 6,029,167 | A | 2/2000 | Evans |
| 6,052,416 | A | 4/2000 | Koga |
| 6,078,619 | A | 6/2000 | Monro et al. |
| 6,086,706 | A | 7/2000 | Brassil et al. |
| 6,125,348 | A | 9/2000 | Levine |
| 6,144,835 | A | 11/2000 | Inoue |
| 6,208,744 | B1 | 3/2001 | Ishige et al. |
| 6,336,050 | B1 | 1/2002 | Amin et al. |
| 6,434,542 | B1 | 8/2002 | Farmen et al. |
| 6,480,547 | B1 | 11/2002 | Chen et al. |
| 6,556,719 | B1 | 4/2003 | Monro |
| 6,625,213 | B2 | 9/2003 | Bottreau et al. |
| 6,654,503 | B1 | 11/2003 | Sudharsanan et al. |

(Continued)

FOREIGN PATENT DOCUMENTS

EP 0 595 599 A2 5/1994

(Continued)

OTHER PUBLICATIONS

Choog Soo Park et al., "Lost Motion Vector Recovery Algorithm," Circuits and Systems, IEEE International Symposium on London, vol. 3, 1994, pp. 229-232.

(Continued)

*Primary Examiner*—Allyson N Trail
(74) *Attorney, Agent, or Firm*—Sterne, Kessler, Goldstein & Fox P.L.L.C.

(57) ABSTRACT

Briefly, in accordance with one embodiment, a method of data compression is disclosed.

27 Claims, 2 Drawing Sheets

U.S. PATENT DOCUMENTS

| | | | |
|---|---|---|---|
| 6,820,079 B1 | 11/2004 | Evans | |
| 6,874,966 B2 | 1/2005 | Sommer et al. | |
| 6,990,145 B2 | 1/2006 | Monro et al. | |
| 7,003,039 B2 | 2/2006 | Zakhor et al. | |
| 7,079,986 B2 | 7/2006 | Sieracki | |
| 7,230,551 B2 | 6/2007 | Moriya et al. | |
| 2002/0069206 A1 | 6/2002 | Bergman et al. | |
| 2003/0018648 A1* | 1/2003 | Kerofsky | 707/102 |
| 2003/0108101 A1 | 6/2003 | Frossard et al. | |
| 2004/0028135 A1 | 2/2004 | Monro | |
| 2004/0126018 A1 | 7/2004 | Monro | |
| 2004/0165737 A1 | 8/2004 | Monro | |
| 2004/0218836 A1 | 11/2004 | Kanatsu | |
| 2005/0149296 A1 | 7/2005 | Sieracki | |
| 2007/0016414 A1 | 1/2007 | Mehrotra et al. | |
| 2007/0030177 A1 | 2/2007 | Monro | |
| 2007/0040711 A1* | 2/2007 | Ziauddin | 341/51 |
| 2007/0053434 A1 | 3/2007 | Monro | |
| 2007/0053597 A1 | 3/2007 | Monro | |
| 2007/0053603 A1 | 3/2007 | Monro | |
| 2007/0164882 A1 | 7/2007 | Monro | |
| 2007/0223579 A1* | 9/2007 | Bao | 375/240.12 |
| 2007/0252733 A1 | 11/2007 | Thebault et al. | |
| 2007/0258654 A1 | 11/2007 | Monro | |
| 2007/0271250 A1 | 11/2007 | Monro | |
| 2007/0282933 A1 | 12/2007 | Monro | |
| 2007/0290899 A1 | 12/2007 | Monro | |
| 2008/0005648 A1 | 1/2008 | Monro | |
| 2008/0055120 A1 | 3/2008 | Monro | |
| 2008/0056346 A1 | 3/2008 | Monro | |
| 2008/0084924 A1 | 4/2008 | Monro | |
| 2008/0086519 A1 | 4/2008 | Monro | |

FOREIGN PATENT DOCUMENTS

| | | |
|---|---|---|
| EP | 0 836 325 A1 | 4/1998 |
| EP | 1 545 010 A1 | 6/2005 |
| EP | 1 610 560 A | 12/2005 |
| GB | 2 293 733 A | 4/1996 |
| GB | 2 409 943 A | 7/2005 |
| WO | WO97/16029 | 5/1997 |
| WO | WO98/11730 | 3/1998 |
| WO | WO99/08449 | 2/1999 |
| WO | WO01/15456 | 3/2001 |
| WO | WO01/63935 | 8/2001 |
| WO | WO02/13538 | 2/2002 |
| WO | WO2004/051863 | 6/2004 |
| WO | WO2005/027049 | 3/2005 |
| WO | WO 2005/064799 | 7/2005 |
| WO | WO 2005/067661 | 7/2005 |
| WO | WO2005/119581 | 12/2005 |
| WO | WO2007/030702 | 3/2007 |
| WO | WO2007/030784 | 3/2007 |
| WO | WO2007/030785 | 3/2007 |
| WO | WO2007/030788 | 3/2007 |
| WO | WO 2007/084336 | 7/2007 |
| WO | WO 2007/118220 | 10/2007 |
| WO | WO 2007/145875 | 12/2007 |
| WO | WO 2007/149358 | 12/2007 |
| WO | WO 2007/149383 | 12/2007 |
| WO | WO 2007/149384 | 12/2007 |
| WO | WO 2008/027450 | 3/2008 |
| WO | WO 2008/030426 | 3/2008 |
| WO | WO/2008/045280 | 4/2008 |
| WO | WO/2008/045281 | 4/2008 |

OTHER PUBLICATIONS

International Search Report for Appln. No. PCT/US2008/002179, issued Aug. 20, 2008, 12 pgs.

Non-Final Office Action for U.S. Appl. No. 11/255,090, dated Dec. 15, 2008, 11 pgs.

International Search Report and Written Opinion for Appln. No. PCT/US2008/002101, dated Dec. 12, 2008, 13 pgs.

Cotter et al., "Application of Tree-Based Searches to Matching Pursuit," 2001 IEEE International Conference on Acoustics, Speech and Signal Processing, New York, NY, vol. 6, 7, May 2001, pp. 3933-3936.

Shoa et al., "Tree Structure Search for Matching Pursuit," Image Processing, 2005, vol. 3, 11, pp. 908-911.

Qiangsheng Liu et al., "A low-cost video encoder with matching pursuit," Intelligent Multimedia, Video and Speech Processing, May 2, 2001, pp. 502-505.

Yuan Yuan et al., "Improved Matching Pursuits Image Coding," Acoustics, Speech, and Signal Processing, 2005, vol. 2, 18, pp. 201-204.

International Search Report and Written Opinion for Appln. No. PCT/US2008/002100, dated Dec. 12, 2008, 14 pgs.

International Search Reportfor Appln. No. PCT/US2007/021302, dated Dec. 10, 2008, 5 pgs.

Haoxing Zhang et al., "A Hybrid Video Coder Based on H.264 with Matching Pursuits," Acoustics, Speech and Signal Processing, 2006, p. 889.

Yuan et al., "3D Wavelet Video Coding with Replicated Matching Pursuits," Sep. 11, 2005, Image Processing, pp. 69-72.

Monro et al., "Subband Adaptive Dictionaries for Wavelet/Matching Pursuits Image Coding," Oct. 8, 2006, Image Processing, p. 2136.

Chien-Kai et al., "Matching Pursuits Low Bit Rate Video Coding with Codebooks Adaptation," Jun. 5, 2000, Acoustics, Speech, and Signal Processing, pp. 408-411.

International Search Report for Appln. No. PCT/US2007/021303, dated Dec. 12, 2008, 5 pgs.

Rabiee et al., "Scalable Subband Image Coding with Segmented Orthogonal Matching Pursuit," Oct. 4, 1998, Image Processing, pp. 774-777.

Rabiee et al., "Low-bit-rate Subband Image Coding with Matching Pursuits," Visual Communications and Image Processing, vol. 3309, 1998, pp. 875-880.

Schmid-Saugeon et al., "Dictionary Design for Matching Pursuit and Application to Motion-Compensated Video Coding," 2004, IEEE Transactions on Circuits and Systems for Video Technology, pp. 880-886.

International Search Report for Appln. No. PCT/US2007/019297, dated Dec. 12, 2008, 5 pgs.

Non-Final Office Action for U.S. Appl. No. 11/422,316, mailed Dec. 4, 2008, 13 pgs.

Non-Final Office Action for U.S. Appl. No. 11/255,090, mailed Dec. 15, 2008, 15 pgs.

Non-Final Office Action for U.S. Appl. No. 11/332,777, mailed Feb. 25, 2009, 6 pgs.

Final Office Action for U.S. Appl. No. 11/425,142, mailed Mar. 2, 2009, 18 pgs.

Non-Final Office Action for U.S. Appl. No. 11/677,511, mailed Feb. 20, 2009, 23 pgs.

Non-Final Office Action for U.S. Appl. No. 11/677,515, mailed Feb. 25, 2009, 21 pgs.

Brin et al., Copy detection mechanisms for digital documents, Proceedings of the 1995 ACM SIGMOD international conference on Management of data SIGMOD '95, Volumer 24 ACM Press, May 1995, pp. 398-409.

Cancedda et al., Word Sequence Kernels, Mar. 2003, MIT Press, Journal of Machine Learning Research, vol. 3 Special Edition, pp. 1059-1082.

Cover et al. "Elements of Information Theory" Copyright Jon Wiley & Sons, Inc., p. 96, 1991.

Czerepinski et al., "Matching Pursuits Video Coding: Dictionaries and Fast Implementation" IEEE Trans Circuit Systems Video Technology, vol. 10, No. 7, pp. 1103-1115, Oct. 2000.

Daubechies, "Orthonormal Bases of Compactly Supported Wavelets" Comm. Pure Appl. Math., vol. 41 pp. 909-996, 1998.

De Natale, et al., "A Mesh-Interpolation Scheme for Very-Low Bitrate Coding of Video Sequences" European Transactions on Telecommunications, vol. 9, No. 1, pp. 47-55, 1998.

Figueras et al., "Color Image Scalable Coding with Matching Pursuit" IEEE Int. Conference Acoustics Speech Signal Process, pp. III-53-56, May 2004.

Frossard et al., "High Flexibility Scalable Image Coding" Proceedings of VCIP 2003, Jul. 2003.

Gamito et al. "Lossles Coding of Floating Point Data with JPEG 2000 Part 10" Proceedings of the SPIE, SPIE, Bellingham, VA, US. vol. 5558, Aug. 2, 2004. pp. 276-287.

Golomb, S.W., "Run-length encodings" IEEE Trans Info Theory, Jul. 1966, 12(3):399-401.

Horst et al. " Mupcos: A multi-purpose coding scheme" Signal Processing: Image Communication 5, pp. 75-89, 1993.

Hosang, M., "A Character Elimination Algorithm for Lossless Data Compression" Data Compression Conference, Proceedings. DCC, IEEE Computer Society Press, Los Alamitos, CA, US, Apr. 2, 2002, pp. 1-10.

Huffman, David A., "A Method for the Construction of Minimum-Redundancy Codes," Pro. Inst. Radio Eng., 1952, 9 (40), pp. 1098-1101.

Hull, Jonathan J., "Document Image Matching and Retrieval with Multiple Distortion-Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Jun-peng Bao et al., "A new text feature extraction model and its application in document copy detection" Machine Learning and Cybernetics, 2003, International Conference on Nov. 2-5, 2003 Piscataway, NJ, USA, IEEE, vol. 1, Nov. 2, 2003, pp. 82-87.

Larsson, N.J., "The Context Trees of Block Sorting Compression" In Proceedings of the IEEE Data Compression Conference, Snowbird, Utah, Mar. 30-Apr. 1, pp. 189-198. IEEE Computer Society Press, 1998.

Mallat et al., "Matching Pursuits with Time-Frequency Dictionaries" IEEE Trans. Signal Processing, vol. 41. No. 12, pp. 3397-3415, Dec. 1993.

Mallat, "A Theory for Multiresolution Signal Decomposition: The Wavelet Representation" IEEE Trans. Pattern Anal. Mach. Intel., vol. 11, No. 7, Jul. 1989.

Monro et al., "Alignment Blur in Coherently Averaged Images" IEEE Transactions on Signal Processing, vol. 4, No. 6, pp. 1596-1601, Jun. 1996.

Monro et al., "Bases for Low Complexity Matching Pursuits Image Coding" Dept. of Electron. & Electr. Eng., Bath Univ., UK, 2005. IEEE International Conference on Image Processing, Publication Date: Sep. 11-14, 2005. vol. 2, pp: 249-252.

Monro et al., "Improved Coding of Atoms in Matching Pursuits" IEEE Int. Conference. Image Processing, vol. 2, Sep. 2003.

Monro et al., "Visual Embedding of Wavelet Transformation Coefficients" IEEE International Conference Image Process, pp. 186-189, Sep. 2000.

Monro, "Basis Picking for Matching Pursuits Image Coding" IEEE International Conference on Image Processing, pp. 2495-2498, Sep. 2004.

Moschetti et al., "New Dictionary and Fast Atom Searching Method for Matching Pursuit Representation of Displaced Frame Difference" IEEE International Conference on Image Processing, pp. II-685-688, Sep. 2002.

Neff et al., "Matching Pursuit Video Coding-Part I: Dictionary Approximation" IEEE Trans. Circuits System Video Technology, vol. 12, No. 1, pp. 13-26, Jan. 2002.

Neff et al., "Very Low Bit-Rate Video Coding Based on Matching Pursuits" IEEE Trans. Circuits and Systems for Video Tech., vol. 7, No. 1, pp. 158-171, Feb. 1997.

Poh et al., "Comparison of Residual Compression Methods in Motion Compensated Video" IEEE Int. Workshop on Multimedia Signal Processing, pp. 109-112, Dec. 2002.

R. F. Rice, "Some Practical Universal Noiseless Coding Techniques, " Jet Propulsion Laboratory, Pasadena, California, JPL Publication 79-22, Mar. 1979.

Ramchandran et al., "Best Wavelet Packet Bases in a Rate-Distortion Sense" IEEE Transactions on Signal Processing, vol. 2, No. 2, pp. 160-175, Apr. 1993.

Said et al., "A New, Fast, and Efficient Image Codec Based on Set Partitioning in Heirarchical Trees" IEEE Transactions on Circuits and Systems for Video Technology, vol. 6, No. 3, pp. 243-250, Jun. 1996.

Sayood, Khalid, "Introduction to Data Compression" Morgan Kaufmann Publishers Inc., San Francisco, CA, USA 1996, pp. 27-32.

Sayood, Khalid, "Introduction to Data Compression" Morgan Kaufmann Publishers Inc., San Francisco, CA, USA 1991, pp. 98-99.

Salomon, "Data Compression: the complete reference", Springer, pp. 32-33, 1998.

Schleimer et al., Data security protection: Winnowing: local algorithms for document fingerprinting, 2003 ACM SIGMOD international conference on Management of data (SIGMOD '03), ACM Press, Jun. 2003, pp. 76-85.

Shapiro, "Embedded Image Coding Using Zerotrees of Wavelet Coefficients" IEEE Transactions on Signal Processing, vol. 41, No. 12, pp. 3445-3462, Dec. 1993.

Steffen et al., "Theory of Regular M-band Wavelets Bases" IEEE Transactions on Signal Processing, vol. 41. No. 12, pp. 3497-3511, Dec. 1993.

Teuhola, J. "A Compression Method for Clustered Bit-Vectors" Information Processing Letters, Amsterdam, NL, vol. 7, No. 6, pp. 308-311, Oct. 1978.

Tian et al., "Image Data Processing in the Compressed Wavelet Domain" Proceedings of ICSP'96, pp. 978-981, 1996.

Tredwell et al., "A Sequential Vector Selection Algorithm for Controllable Bandwidth Motion Description Encoding" IEEE Sympos. Intell. Multimedia. Video & Speech Process, May 2001.

Trott et al. "Wavelets Applied to Lossless Compression and Progressive Transmission of Floating Point Data in 3-D Curvilinear Grids" IEEE Proceedings of the Visualization Conference, Oct. 27, 1996, pp. 385-388.

Yuan et al., "Improved Matching Pursuits Image Coding" IEEE International Conference on Acoustics, Speech and Signal Processing ICASSP 2005, pp. II-201-204, Mar. 2005.

Yuan et al., "Low Complexity Separable Matching Pursuits" IEEE Int. Conference Acoustics Speech Signal Process, pp. III-725-728, May 2004.

Donald Monro, U.S. Appl. No. 11/677,515 filed, Feb. 21, 2007, entitled "Hierarchical Update Scheme for Extremum Location with Indirect Addressing".

Donald Monro, U.S. Appl. No. 11/678,004 filed, Feb. 22, 2007, entitled, "Video Coding With Motion Vectors Determined by Decoder".

Donald Monro, U.S. Appl. No. 11/678,479, filed, Feb. 23, 2007, entitled, "Video Coding With Embedded Motion".

Donald Monro, U.S. Appl. No. 11/777,256, filed Jul. 11, 2007.

Donald Monro, U.S. Appl. No. 11/677,511, filed Feb. 21, 2007, entitled "Hierarchical Update Scheme For Extremum Location".

Donald Monro, U.S. Appl. No. 11/777,239, filed Jul. 12, 2007.

Donald Monro, U.S. Appl. No. 11/777,230, filed Jul. 12, 2007.

Donald Monro, U.S. Appl. No. 11/777,130, filed Jul. 12, 2007.

Donald Monro, U.S. Appl. No. 11/777,144, filed Jul. 12, 2007.

Donald Monro, U.S. Appl. No. 11/777,122, filed Jul. 12, 2007.

Donald Monro, U.S. Appl. No. 11/777,100, filed Jul. 12, 2007.

Donald Monro, U.S. Appl. No. 11/777,081, filed Jul. 12, 2007.

Donald Monro, U.S. Appl. No. 11/777,022, filed Jul. 12, 2007.

Donald Monro, U.S. Appl. No. 11/776,786, filed Jul. 12, 2007.

Donald Monro, PCT Serial No. PCT/US2007/008861, filed Apr. 9, 2007, entitled "Motion Assisted Data Enhancement".

Donald Monro, PCT Serial No. PCT/US2008/002100, filed Feb. 19, 2008, entitled "Hierarchical Update Scheme for Extremum Location".

Donald Monro, PCT Serial No. PCT/US2008/002101, filed Feb. 19, 2008, entitled "Hierarchical Update Scheme for Extremum Location with Indirect Addressing".

International Search Report for Appln. No. PCT/US2007/013100 issued Jan. 14, 2008, 4pgs.

International Search Report for Appln. No. PCT/US2007/000759 issued Feb. 14, 2008, 7pgs.

International Search Report for Appln. No. PCT/US2007/014138 issued Oct. 29, 2007, 2 pgs.

International Search Report for Appln. No. PCT/US2007/014182 issued Jan. 18, 2008, 1 pg.
International Search Report for Appln. No. PCT/US2007/014181 issued Jan. 14, 2008.
Non-Final Office Action for U.S. Appl. No. 11/255,090, completed Feb. 2, 2008, mailed Feb. 6, 2008, 14pgs.
Non-Final Office Action for U.S. Appl. No. 11/332,777, completed Dec. 12, 2007, mailed Dec. 21, 2007, 4pgs.
Final Office Action for U.S. Appl. No. 11/425,142, completed Sep. 10, 2007, mailed Sep. 18, 2007, 9 pgs.
Non-Final Office Action for U.S. Appl. No. 11/425,142, completed Mar. 7, 2007, mailed Mar. 20, 2007, 8 pgs.
Non-Final Office Action for U.S.Appl. No. 11/470,611, completed Aug. 29, 2007, mailed Sep. 5, 2007, 6 pgs.
Written Opinion for Appln. No. PCT/US2007/000759 completed Feb. 14, 2007, mailed Feb. 25, 2008, 11pgs.
International Search Report for Appln. No. PCT/US2007/019034 issued Apr. 8, 2008, 2pgs.
Written Opinion for Appln. No. PCT/US2007/019034 completed Mar. 31, 2008, mailed Apr. 8, 2008, 7pgs.
International Search Report for Patent Cooperation Treaty Appln. No. PCT/US2007/019034 issued Apr. 8, 2008, 2pgs.
Written Opinion for Patent Cooperation Treaty Appln. No. PCT/US2007/019034 completed Mar. 31, 2008, mailed Apr. 8, 2008, 7pgs.
Non-Final Rejection for U.S. Appl. No. 11/470,611, mailed on Jun. 30, 2008, 5 pgs.
Non-Final Rejection for U.S. Appl. No. 11/422,316, mailed on Jul. 3, 2008, 7 pgs.
Final Office Action for U.S. Appl. No. 11/332,777, mailed Aug. 13, 2008, 5 pgs.
Final Office Action for U.S. Appl. No. 11/255,090, mailed Sep. 3, 2008, 11 pgs.
Non-Final Office Action for U.S. Appl. No. 11/425,142, mailed Sep. 16, 2008, 12 pgs.

* cited by examiner

DATA COMPRESSION

FIELD

The present patent application relates to data compression.

BACKGROUND

As is well-known, efficient data coding for storage or transmission continues to be an area in which new approaches are sought. For example, if data may be coded more efficiently, such as by compression, the amount of memory to store data to be coded may be reduced. Likewise, in communications systems, if data may be coded efficiently, for a communications channel of a given bandwidth, for example, potentially more information may be transmitted in a given unit of time. These goals and many others may be the object of methods for efficient compression of data.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

As previously alluded to, one potential, although not exclusive, application of an embodiment of claimed subject matter may be in the field of low bit rate audio and/or video coding. It is typically desirable in this particular field, for example, to compress data relatively efficiently. In this and analogous fields, it may also be desirable, as suggested previously, to transmit information across a communications channel, such as a channel that may be subject to restrictions on the number of bits that may be transmitted, or on the bit transmission rate. Therefore, relatively efficient coding may result in more information being transmitted per unit time, for example. Another application, also previously suggested, may be in the compression of data on an electronic device, such as for storage of the data, for example. This may, for example, reduce the amount of memory employed, for example, or, as another example, facilitate transmission of the data by reducing the size of an attachment to an email. Of course, claimed subject matter is not limited to these simple examples. These are provided simply for purposes of illustration.

Golomb coding is well-known and described in Golomb, S W: 'Run-length encodings', *IEEE Trans. Inf. Theory*, 1966, 7, (12), pp. 399-401. Golomb Codes are simply one example of data coding. Therefore, while many of the examples described later are presented in terms of Golomb coding, it should be clear that it is intended that claimed subject matter not be limited in scope simply to Golomb codes (GCs). Other approaches to coding data may be employed and provide satisfactory results. Nonetheless, continuing with Golomb coding as one example, GCs are often used for run length coding, but, in principle, they are general purpose codes that may be used to encode any symbol, or sequence of symbols, as an integer numeral or a sequence of integer numerals. In one possible embodiment, a unique integer numeral may be assigned to a symbol and the symbol may then be coded by Golomb coding the corresponding numeral, for example. GCs have an advantage that the range of numerals need not be known or constrained in advance.

In one particular example, a Golomb Code of a numeral I, modulo K (where K is the 'base,' in this example) may be defined by (S, E, R) as follows:

S=the Sign of the numeral I, if appropriate (may be omitted if the numerals are either all positive or all negative).

M=the Magnitude of I

E=the exponent fix($\log_K(M)$), where fix( ) denotes here a truncation operation, that is, rounding to the next lowest integer numeral.

R=M-$K^E$, is referred to here as a "residual."

The Magnitude of I, therefore, may be obtained by M=$K^E$+R.

It is noted however, that $\log_K(0)$ may provide a mathematical quirk in that K raised to any power should not provide zero. One approach that may be employed to address this includes adding 1 to all non-negative integer numerals so that $\log_K(0)$ should not occur, although, of course, claimed subject matter is not limited in scope in this respect.

Figure 1:
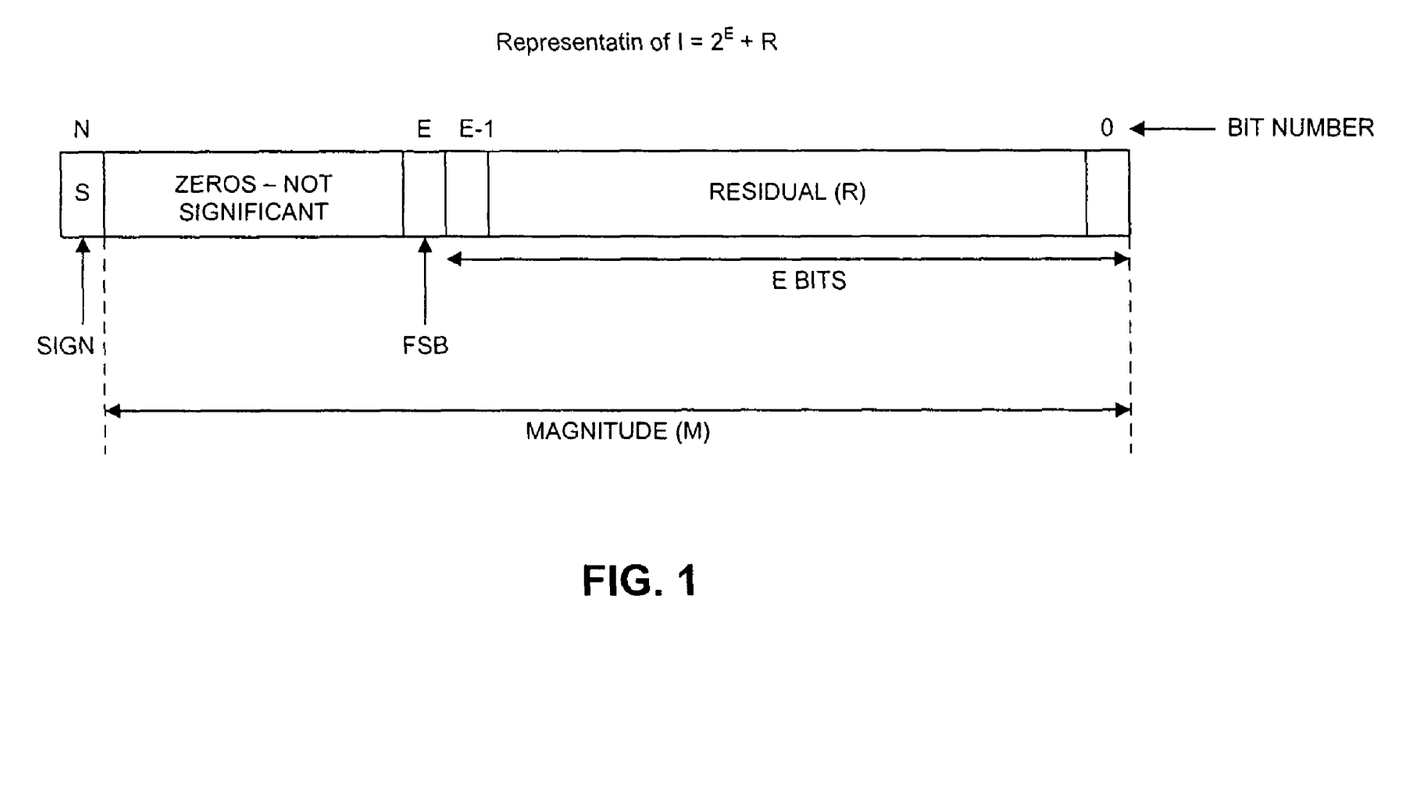
FIG. 1 is a schematic diagram illustrating one embodiment of a technique for data coding.

At times, out of convenience, for example, K=2, so that a Golomb Code, for example, may provide a form of a binary floating point representation of variable length, with exponent E and residual R of variable length E bits. This case is illustrated in FIG. 1, for example, although claimed subject matter is not limited in scope in this respect, of course.

As described in co-pending U.S. patent application Ser. No. 11/422,316, titled "Data Coding," by Monro, filed on Jun. 5, 2006, and assigned to the assignee of the presently claimed subject matter, in one embodiment, a method of coding a data symbol may be employed, comprising Golomb-coding. However, as explained previously, claimed subject matter is not limited in scope to Golomb coding. In such an embodiment, a symbol may be Golomb-coded by an exponent value E and a residual value R, the exponent value being coded substantially according to a variable length code, again, as described in more detail below.

In this particular embodiment, for example, a Variable Length Code (VLC) may be employed to make substitutions for symbols in which short codes may be used for more frequently occurring symbols and longer codes for less frequently occurring symbols. In this way, the average length of a code may be reduced. One well-known example of a VLC comprises Huffman coding, although many other examples exist. For example, Fano/Shannon coding comprises a VLC, as does the Morse code, which substitutes short codes for frequently occurring letters like E (one dot) and longer ones for others like X (dash dot dot dash). Of course, claimed subject matter is not limited in scope to these examples. These are provided merely for purposes of illustration.

Likewise, another embodiment may comprise a method of coding a symbol by a corresponding positive non-zero numeral V. The largest integral value of an exponent E for which $b^E$ does not exceed V, where b is an integer numeral modulo value, and $E=\text{fix}(\log_b(V))$, may be determined. Likewise, a residual $R=V-b^E$ may be calculated. A symbol code may therefore be generated that includes the value of an exponent, coded as a variable length code, and a residual value. Of course, claimed subject matter is not limited in scope to this particular embodiment. This is simply one example of an embodiment included within the scope of claimed subject matter.

Various modifications are possible and all are intended to be included within the scope of claimed subject matter. For example, in one alternate embodiment, the symbols may optionally be contained within a symbol alphabet which ranks symbols by expected probability of occurrence, the value of V representing the symbol rank.

Likewise, in one embodiment, a Variable Length Coder (VLC), such as, for example, a Huffman Coder, may encode the exponent of a code, such as a Golomb Code, for example, for efficiently coding and compressing a stream of symbols. However, the VLC may be adaptive or static, depending, for example, on the particular embodiment.

Although claimed subject matter is not limited in scope in this respect, it is noted that embodiments of a coding procedure as described herein may at times outperform Huffman Coding in real applications. Likewise, while claimed subject matter is not limited in scope in this respect, embodiments may be conveniently applied to run length coding and/or for use with awkward probability distributions, although these are merely examples, and claimed subject matter is not limited in scope in this respect.

Example embodiments, in addition to an embodiment of a method of coding of data, may include a computer program incorporating such a method; and/or a coder, such as one implemented in hardware, firmware, software, or combinations therefore. Embodiments may also include video and/or audio codecs embodying such a method; video and/or audio compression systems whereby data may be encoded according to such a method, and in which such data may then be transmitted across a communications channel for reconstruction by a decoder at the far end. Alternatively, the coded data may be stored rather than transmitted. These and many other embodiments are included within the scope of claimed subject matter.

FIG. 1, for example, shows an embodiment of a Golomb-coded N bit fixed point binary numeral, using sign and magnitude representation. The leading bit S (which may be omitted in an alternate embodiment) indicates the sign. This is followed by a number of non-significant leading zeros. The first significant bit (FSB) occurs at location E, with the location of the FSB thereby indicating the value of the exponent. The remaining bits are represented by the subsequent E bits, this being known as the "residual" R in this context. The magnitude M of the numeral, in this representation, is simply the value of the binary numeral represented by the N bits labelled 0 to N−1.

Here, sign=1 or 0

Likewise, Magnitude=$M=\Sigma 2^n b_n$ where $b_n$ is the value of bit n, 0 or 1, and the summation runs from n=0 to N.

E=Position of FSB=$\text{fix}(\log_2 M)$ for M>=1

R=Residual=$M-2^E$ which has E bits for E>=1 and M>=2.

Given the representation of FIG. 1, to transmit data across a communications channel, one may, in this embodiment, send values of S (if appropriate) along with a positional value E and a value of a residual R. Typically, the residual value is not encoded, and the bits are simply sent one by one, as they are. However, entropy coding of a residual may be employed in some embodiments, of course.

A value of E may, in some situations, be challenging to transmit, in that the number of bits to transmit E may typically be variable, as is the number of bits to send a residual. A common way of implementing a Golomb coder is to transmit not the value of E but, instead, the change in E with respect to the last value that was sent. For example, the sending of a first symbol may indicate that the value of E has increased by 1, whereas the sending of a second symbol may indicate that the value has decreased by 1. The sending of a third symbol may indicate that the value of E remains the same. The differences between the successive values of E may, in practice, be transmitted as successive bits, although claimed subject matter is not limited in scope in this respect. Further details may be found, for example, in Rice, R F: 'Some practical universal noiseless coding techniques', *Tech. Rep. JPL*-79-22, Jet Propulsion Laboratory, Pasadena, Calif., March 1979. Huffman Coding is also a well-known method of coding data, details of which may be found in Huffman, D.: 'A method for the construction of minimum redundancy codes', *Proc. Inst. Radio Eng.*, 1952, 9, (40), pp. 1098-1101.

In the binary case, if the maximum value of E that may occur is Max_E, the uncoded representation of all values from 0 to Max_E employs 1+fix($\log_2$Max_E) bits. Since it is a feature of a Golomb Code that we do not necessarily know the range of numerals, it follows that we do not necessarily know the size of Max_E. Once E is known for a particular numeral, however, it is then known that the value of R employs E bits.

Golomb Coding, as an example embodiment, works well at least in part because the probability density of R is normally relatively flat, even in cases where the probability density of M is uneven or skewed. The skewness of the distribution will be largely represented in the distribution of E, although even that is generally well-behaved. There is a smoothing effect on E because any value of E which is greater than 1 covers a range of $2^E$ different values of M in this particular embodiment. There is a flattening effect on R because the number of values of R is less than the number of possible values of M. One aspect of this particular embodiment relates to recognizing that the efficient operation of a coder is dependent at least in part on the "cost" of coding E. Therefore, a reduction in this cost may be desirable. For example, if the range of E is constrained, say 1<E<Max_E, it may be acceptable to code E by the binary numeral E−1 of 1+fix($\log_2$(Max_E−1)) bits. In this context, we define a method of coding E simply by its bits as a Raw Code. Furthermore, if K and Max_E are both powers of 2, this may produce good results, although claimed subject matter is, of course, not limited in scope in this respect.

A comparative example may serve to show that employing a Raw Code, such as a Raw Golomb Code, may provide a reasonable technique for coding data. Suppose we wish to transmit a sequence of numerals, and that all numerals from 1 to 8 are equally likely with no correlation between successive numerals. Effectively, this is like the outcome of throwing a dice of 8 sides. One way of coding and transmitting such data is to use a Variable Length Coder (VLC), such as a Huffman coder.

As is well-known, the theoretical cost of coding, or the entropy, of this sequence of numerals is $\log_2 8 = 3$ bits and simply sending the value as three bits is an optimum code. In theory, a well-constructed VLC, such as a Huffman coder, would recognize this and also produce the optimum code. However in practice, this may not occur, such as if the VLC is adaptive and is forming its codes from real sequences of numerals which are not likely to have a flat observed histogram of occurrence. Thus, it may be possible, for example, that a VLC will assign the symbols as having different probabilities and so assign a 1-bit code to the one the coder determines is most common, a 2-bit code to the next, and so on. In this example, we can suppose that the numerals from 1 to 7 have 1 to 7 bits, and we may code the value 8 by 7 bits as well. In this case, the VLC will on average use ⅛(1+2+3+4+5+6+7+7) bits, here 35/8=4.375 bits, nearly 46% greater than the optimum. It is not generally appreciated that a Huffman coder may at times perform so badly.

A Raw Golomb Code, on the other hand, will do better in transmitting the same sequence of numerals, although this is simply one possible example. The range of E in this case is 0-3, which we may communicate with 2 bits.

We can list the number of bits employed for the 8 possible numerals:

| Value | E | E Bits | R | R Bits | Total Bits |
|---|---|---|---|---|---|
| 1 | 0 | 2 | — | 0 | 2 |
| 2 | 1 | 2 | 0 | 1 | 3 |
| 3 | 1 | 2 | 1 | 1 | 3 |
| 4 | 2 | 2 | 0 | 2 | 4 |
| 5 | 2 | 2 | 1 | 2 | 4 |
| 6 | 2 | 2 | 2 | 2 | 4 |
| 7 | 2 | 2 | 3 | 2 | 4 |
| 8 | 3 | 2 | 0 | 0 | 2 |

This code will, on average, use 26/8 bits, here about 8% over the optimum. If we say we do not know in advance that 8 is the maximum numeral, one may allow for a 4-bit residual if 8 occurs. Then, the average is 30/8 bits, or 25% over the optimum. Nonetheless, as this example demonstrates, a Raw Golomb code here performs better than a Huffman code.

At this point, we note that if data to be transmitted comprises a series of Golomb Codes, for example, further compression may be achieved by considering the sequence as a whole rather than, as with existing or state-of-the-art systems or approaches, transmitting individual codes one by one.

As illustrated schematically in FIG. 1, a Golomb Code may typically comprise the form (S, E, R) where S represents sign, E represents exponent and R represents residual. A data stream comprising a sequence of such Golomb Codes may therefore, in one example, at least, take the following form:

$S_1\ E_1\ R_1\ S_2\ E_2\ R_2\ S_3\ E_3\ R_3 \ldots S_8\ E_8\ R_8.$

By treating this sequence of 8 (or however many there may be) Golomb Codes as a single string, additional compression may be achieved. In this particular example, this may be achieved for different values of $E_i$, where i represents an integer numeral, via positions i at which $E_i$ occurs. For compression, a sequence of values $E_i$ may have particular interest, since the values of $R_i$ are not typically susceptible of significant further compression, and may therefore be transmitted as plain, that is, uncompressed, values. Likewise, if signs $S_i$ exist, they may conveniently be incorporated into a code stream. Of course, if all of the data are of the same sign, signs $S_i$ may be omitted.

We assume here that a sequence of Golomb Codes are to be treated as a single string. As a result, values may be transmitted in any convenient order. Once a value of a particular $E_i$ is known, that defines the number of bits within associated $R_i$. Therefore, in some embodiments, it may be convenient to follow an $E_i$ by its corresponding $R_i$. However, many other arrangements are, of course, possible, such as deferring some or all R and S values until the end of the string, for example. It is intended that the scope of claimed subject matter include any and all such possible arrangements.

We assume that locations of R values (and S values, if any) within a string may be varied without significant degradation in compression. As a result, for convenience of discussion and illustrative purposes, we consider the sequence of $E_i$ values without other values. That is, for the sake of illustration, we assume an arrangement of respective $E_i$ values within a particular string may be as follows:

| $E_1$ | $E_2$ | $E_3$ | $E_4$ | $E_5$ | $E_6$ | $E_7$ | $E_8$ |
|---|---|---|---|---|---|---|---|
| 1 | 4 | 2 | 1 | 3 | 2 | 4 | 4 |

In this particular embodiment, we may, if desired, record and likewise transmit positions i within the string of the possible values of $E_i$. So, in the example above, value 1 may be found at positions 1 and 4 within the string, value 2 at positions 3 and 6, value 3 at position 5, and value 4 at positions 2, 7 and 8. This information may be encoded in any convenient manner, and may be stored or transmitted, for example. One way of achieving this, although this is merely one simple example and is not intended to limit the scope of claimed subject matter, is to communicate the following symbols:

1 4 EOG 3 6 EOG 5 EOG 2 7 8 EOG

Here, EOG is used to represent End Of Group, here, for this example, the end of a sequence of grouped E values.

In more general terms, a coder may run through a range of E values and indicate the positions of Golomb Codes, for example, in a sequence that includes values of E. In Pseudocode, one potential representation of this approach is the following, although this is merely an example:

```
For E = Range of E Values
    Indicate positions of Golomb Code(s) containing E
    Indicate End Of E Group (EOG)
End
```

Residuals $R_i$ and, if appropriate, signs $S_i$ may be, as mentioned above, communicated in any convenient location such as, for example, interleaved after a positional code or after an EOG symbol. If an $E_i$ value is reconstructed by a decoder, for example, the decoder may, without receiving additional data, determine the length of an associated $R_i$ and, without receiving additional data, determine the expected number of $R_i$ bits that will follow, which is $E_i$ bits for $E_i >= 1$ and $M_i >= 2$ as explained above, where $M_i = 2^{Ei} + R_i$.

It will be noted that in the embodiment discussed above, a decoder is not actually transmitted data that specifically represents the value of E within a group, for example. Instead, such information is implicit and derivable from position information, such as the position of a group within the transmitted list of symbols for this particular embodiment, for example. It is, of course, also noted that many other different embodiments are included within the scope of claimed subject matter. For example, claimed subject matter is not limited in scope to a particular convention regarding the association between position and the particular data value being transmitted. Any one of a host of possible arrangements or associations are possible and are included within the scope of claimed subject matter.

Likewise, if a possible value of $E_i$ is not present within a string, a null group, as one example, may be transmitted. For example, in one particular embodiment, this may be indicated by an extra EOG symbol, such as by as "EOG EOG," e.g., an extra EOG symbol in an appropriate position for an empty group. Of course, this is, again, merely one embodiment and many other approaches to communicating that a value is not present may be employed within the scope of claimed subject matter.

It is noted that the particular embodiment just described provides efficiencies over convention data compression approaches; however, additional efficiency may also be achieved, as described below, and such embodiments are also intended to be included within the scope of claimed subject matter. For example, positions 1 to 8 occur once. Typically, therefore, 3 bits per symbol may be employed to communicate this by a coding method. However, another approach that may improve compression would instead indicate gaps between positions, such as in run length encoding, for example. In this case, instead of sending 1 followed by 4 to indicate the positions of the E value 1, one might send a 0 to indicate no positions were skipped before the first occurrence of E, followed by 2 to indicate that two positions are skipped to get from position 1 to position 4, and so on:

0 2 EOG 2 2 EOG 4 EOG 1 4 0 EOG

This is more efficient from fewer symbols, here: 0, 1, 2, 4, and EOG.

However, efficiency may be improved still further in another embodiment within the scope of claimed subject matter. As transmission proceeds, typically available space of a run length coder becomes smaller, as more and more of the values become known. So, for example, as a first E group is communicated, positions of E=1 become known. Additionally, these positions may be ignored during processing as possible positions for later E values. Therefore, a run length code may "ignore" these values during processing and signal unknown positions to be skipped, as follows:

0 2 EOG 1 1 EOG 1 EOG 0 0 0 EOG

Here, then, the number of symbols have effectively been reduced even further, to 0, 1, 2 and EOG.

Depending at least in part upon the application in hand, more sophisticated coding schemes may also be employed, such as, for example, using approaches described in PCT patent application WO 2005/027049 A1, titled "Data Compression," by Monro, filed on Sep. 18, 2003 and published on Mar. 24, 2005, also filed as U.S. patent application Ser. No. 10/572,121 on 16 Mar. 2006 with the same title and by the same inventor. Of course, claimed subject matter is not limited in scope to the approaches described in the foregoing PCT and USA patent application. This is simply another example of a potential embodiment within the scope of claimed subject matter. However, in this context, the coding approach described in the foregoing PCT and US patent application is referred to here as a "MERGE coder."

As alluded to above, many of the embodiment described above effectively run length encode a string of data. That string nonetheless may likewise be susceptible to further compression, for example, by means of further Golomb Coding. Thus, for a given value of E, its occurrence in a stream of Golomb Codes might itself be Golomb Coded.

Once a coder comes to a final E value to be coded, most of its positions become known without being communicated. In the previous example, provided it is known that there are 8 Golomb Codes, the symbol stream may be shortened to 0 2 EOG 1 1 EOG 1 EOG However, here, it has been assumed that the range of possible E values is known or is capable of being determined in advance.

In some situations, it may be desirable to have methods if the range of E is not known, and also if the length of a symbol stream is not known. Here, we discuss two possible embodiments within the scope of claimed subject matter to handle such situations, although, again, these are examples and other approaches are included within the scope of claimed subject matter other than simply these two.

Let us assume the length of a symbol stream is known. If so, such a symbol stream might be prefixed by a value for Max_E, for example, as:

4 0 2 EOG 1 1 EOG 1 EOG

In this case, for example, E values may be taken either in ascending or descending order. It is possible that a Min_E value occurs more frequently so that more potential benefit of reduced numbers of symbols might be obtained by employing descending order. It is also possible that both potential values of E, that is Min_E or Max_E, might be signalled. One approach might postfix Max_E and/or Min_E at the end of the symbol stream. However, a delay from a decoder waiting for postfixed values may be disadvantageous in some situations.

Likewise, as an alternative to signalling a final value of E, there might be a symbol introduced which signals or represents "No More Groups," such as in the following:

0 2 EOG 1 1 EOG 1 EOG NoMoreGroups

However, indicating a range of E may typically involve a known starting point and the values may involve progression in a known order. However, if not, perhaps the starting value of E might also be signalled.

In one embodiment, the number of Golomb Codes in a sequence may not be determinable by to a decoder at least soon after the process begins. As positions of successive E values become identified, a decoder still may not be capable of determining an exact number of codes, although at the end of a E group, a decoder may be able to determine a lower bound from the data available. A decoder may be constructed to use the fact that remaining E values are the same after a last E value is reached, but still the number of values in general will be uncertain unless additional approaches are employed to determine this as well.

Approaches to determining the length of a symbol stream are possible. Without this, there may be an unknown number of final symbols that may follow a last known symbol. Assume here that the range of E is known. In the above example, for example, two values of E in which the value was 4 appeared at the end of the string.

One potential approach may include to prefix the length of a string or sequence, whereby a total number of Golomb Codes in a particular string may be indicated before signalling of E positions begins. In this case, after a final E Value is reached, its positions are known, as demonstrated by the example above. Thus, for such an embodiment, one might send as a complete message:

8 0 2 EOG 1 1 EOG 1 EOG

Likewise, another potential method may be to include, as a Run Length, the number of final symbols post-fixed to the symbol stream:

0 2 EOG 1 1 EOG 1 EOG 3

Such methods of prefixing or post-fixing a range of E values and a length of a symbol stream might be used in any combination. How to combine such approaches to achieve better results may depend at least in part on the particular statistics of the symbol stream(s).

The usefulness of embodiments, such as those previously described, may become more readily apparent from discussion of a particular implementation. Of course, claimed subject matter is not limited in scope in this respect. This description is simply for purposes of illustration. As indicated previously, aforementioned PCT application WO 2005/027049 A1, titled "Data Compression," by Monro, filed on Sep. 18, 2003 and published on Mar. 24, 2005, also filed as U.S. patent application Ser. No. 10/572,121 on 16 Mar. 2006 under the same title and by the same inventor, disclosed a technique referred to here as a MERGE coding technique for use in data compression.

In the aforementioned application, data is characterized as a series of atoms. Therefore, the atoms are added together to provide or produce resulting data. In this characterization, an atom is described as a position, sign, amplitude, and an index of a basis function. Amplitude may be constrained to have a fixed number of bits of precision, referred to here as PL (Precision Limit). See also U.S. patent application Ser. No. 10/333,480, under the same title and by the same inventor, and published on Jul. 1, 2004 as US 2004/0126018. It is noted that both of the foregoing applications claim priority to an application filed in Great Britain on Aug. 3, 2000. Of course, claimed subject matter is not limited in scope to employing PL or PLQ. Rather these are merely provided as examples for purposes of illustration.

The approach in the patent application employed the position of a First Significant Bit (FSB) with another remaining PL−1 bits to describe amplitude. Given a precision limit of PL, a process may be employed as follows, for example:

```
For FSB from Maximum to Minimum
    For R_A (the amplitude Residual) from 2^{PL-1} to 0
        For each Basis Function K used
            Signal by Run Length Coding the position
                of each atom with attributes (FSB, R_A, K).
            Send the Sign S of the atom (1 bit)
        End of Basis Function Group
    End of R (PLQ Residual) Group
```

The sub-process shown in bold above represents the primary or central "MERGE" loop for this particular embodiment. However, this may be modified based at least in part on aspects of the previously described embodiments to operate on a sequence of Golomb Codes by run length coding. Applying such an approach here provides the following:

```
For FSB from Maximum to Minimum
    For R_A (the amplitude Residual) from 2^{PL-1} to 0
        For each Basis Function K used
            Make a List of Golomb Codes (E, R_A) which will
            Run Length Code the position of each atom
                with attributes (FSB, R_A, K).
            For each E that occurs
                Run Length Code the Positions of the E Value
                Transmit the corresponding R_E Values (E bits)
                Transmit the corresponding Signs S of the atoms (1 bit)
            End of E Group
        End of Basis Function Group
    End of R (PLQ Residual) Group
```

One might think of this as a coder within a coder, as was alluded to previously. Here, an inner coder based at least in part on exponents E of Golomb Codes is employed for the groups of Atoms. For the above description, subscripts are used to distinguish the Residual of the Amplitude of an Atom, $R_A$, from the Residual of the E value of a Run Length, $R_E$.

As the above implementation example might suggest, it is possible to further run length code E positions to itself be a Golomb Code. Therefore, an additional layer of coding may thereby be nested at an addition level, or even at several additional levels. Statistics regarding positions may at least in part affect the depth to which it may be advantageous to nest such coding. At the deepest level, or at other levels, one may also use some other method of coding the E values. Claimed subject matter is intended to encompass all such potential variations.

Likewise, in some embodiments, resultant streams or strings may, where desirable in a particular application, include a variety of additional or "side" information about data symbols being encoded. For example, if the data symbols are representative of text characters, such side information might include attributes such as color, font, type-face and so on. Such information may be transmitted at the start and/or the end of a sequence or, where more convenient, as part of particular groups. Information could also be transmitted along with encoded position values. A similar approach may also be applied to residual values, although the desirability of such approaches may depend at least in part upon the particular application.

Embodiments in accordance with claimed subject matter may be applied to coding of data of all types, including non-numeric data, such as symbolic data, for example, converted into numerical form by any convenient mapping prior to application of coding. As is noted, embodiments perform well through application run length coding, although it will, of course, be understood that claimed subject matter is not limited necessarily so limited. It is likewise intended that embodiments of claimed subject matter be applied to any one of a number of different types of data coding. Therefore, claimed subject matter is not intended to be limited in terms of the type of data to which it may be applied.

It will, of course, be understood that, although particular embodiments have just been described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive.

Figure 2:
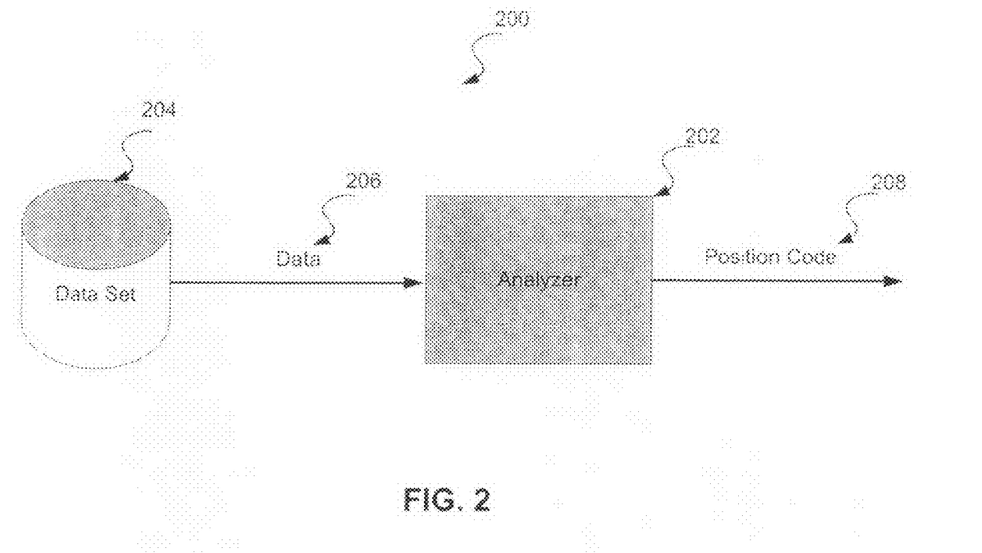
FIG. 2 illustrates an exemplary system.

FIG. 2 illustrates a system 200. System 200 includes an analyzer 202 connected to a data set 204. Analyzer 202 receives data 206 from the data set 204 and produces a position code 208 therefrom. As discussed above, analyzer 202 can be a combination of hardware, software and/or firmware.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method comprising:
generating, by a processing device, a code sequence using Golomb coding of data, such that a code within the code sequence includes $E_i$, wherein i is an integer equal to or greater than 1 representing a position of the code within the code sequence; and
generating, by the processing device, a position code in which positions, i, of respective $E_i$'s having a same value are adjacent each other in the position code and separated by a spacer code.

2. The method of claim 1, further comprising using an End Of Group (EOG) symbol as the spacer code.

3. The method of claim 1, further comprising:
using $E_1=A$, $E_2=B$ as the code sequence, such that A and B are integers equal to or greater than 0; and
using 1EOG2EOG as the position code, such that EOG is the spacer code.

4. The method of claim 3, further comprising using A=B, such that the position code comprises 12EOG.

5. The method of claim 1, further comprising using a residual $R_i$ for the each code within the code sequence.

6. The method of claim 5, further comprising interleaving the residual $R_i$ in the position code.

7. The method of claim 6, further comprising interleaving the residual $R_i$ after the spacer code corresponding to $E_i$.

8. The method of claim 1, wherein the generating the position code comprises generating the position code in which a difference between positions in the code sequence of the similar respective values of the i positions are adjacent each other in the position code and separated by the spacer code.

9. The method of claim 1, wherein the generating the position code further comprises omitting the respective values of the i positions that have already been coded.

10. The method of claim 1, further comprising further coding the position code.

11. The method of claim 10, further comprising Golomb coding the position code.

12. The method of claim 1, further comprising storing or transmitting the position code.

13. The method of claim 1, further comprising using a known length for the code sequence.

14. The method of claim 1, further comprising prefixing to the position code a maximum value of $E_i$.

15. The method of claim 1, further comprising prefixing to the position code a minimum value of $E_i$.

16. The method of claim 1, further comprising post-fixing to the position code a maximum value of $E_i$.

17. The method of claim 1, further comprising post-fixing to the position code a minimum value of $E_i$.

18. The method of claim 1, further comprising combining both maximum and minimum values of $E_i$ with the position code.

19. The method of claim 1, further comprising using a No More Groups signal to indicate end of the position code.

20. The method of claim 1, further comprising prefixing to the position code a length of the code sequence.

21. The method of claim 1, further comprising using non-numerical data symbols for the data and before the generating the code sequence the method further comprises:
converting the non-numerical data symbols into numerical data by mapping.

22. The method of claim 21, further comprising using symbolic data for the non-numerical data symbols.

23. A system, comprising:
an analyzer configured to:
use Golomb coding of data to generate a code sequence, such that a code within the code sequence includes $E_i$, wherein i is an integer equal to or greater than 1 representing a position of the code within the code sequence; and
generate a position code in which positions, i, of respective $E_i$'s having a same value are adjacent each other in the position code and separated by a spacer code.

24. A method comprising:
for data comprising a numeric data symbol $V_i$:
determining, by a processing device, a largest integral value of an exponent $E_i$ for which $b^{Ei}$ does not exceed $V_i$, where b is a fixed modulo value; and
calculating, by the processing device, a residual $R_i=V_i-b^{Ei}$;

generating, by the processing device, a code sequence, such that a code within the code sequence includes the exponent $E_i$, wherein i is an integer equal to or greater than 1 representing a position of the code within the code sequence; and generating, by the processing device, a position code in which positions, i, of respective $E_i$'s having a same value are adjacent each other in the position code and separated by a spacer code.

25. A tangible computer-readable medium having stored thereon computer-executable instructions execution of which by a computing device causes the computing device to perform a method comprising:

using Golomb coding of data to generate a code sequence, such that a code within the code sequence includes $E_i$, wherein i is an integer equal to or greater than 1 representing a position of the code within the code sequence; and generating a position code in which positions, i, of respective $E_i$'s having a same value are adjacent each other in the position code and separated by a spacer code.

26. A computer program product comprising a tangible computer-useable medium having instructions stored thereon, the instructions comprising:

a computer program module that, when executed, uses Golomb coding of data to generate a code sequence, such that a code within the code sequence includes $E_i$, wherein i is an integer equal to or greater than 1 representing a position of the code within the code sequence; and a computer program module that, when executed, generates a position code in which positions, i, of respective $E_i$'s having a same value are adjacent each other in the position code and separated by a spacer code.

27. A computer program product comprising a tangible computer-useable medium having instructions stored thereon, the instructions comprising:

for data comprising a numeric data symbol $V_i$:

a computer program module that, when executed, determines a largest integral value of an exponent $E_i$ for which $b^{Ei}$ does not exceed $V_i$, where b is a fixed modulo value; and a computer program module that, when executed, calculates a residual $R_i = V_i - b^{Ei}$;

a computer program module that, when executed, generates a code sequence, such that a code within the code sequence includes the exponent $E_i$, wherein i is an integer equal to or greater than 1 representing a position of the code within the code sequence; and a computer program module that, when executed, generates a position code in which positions, i, of respective $E_i$'s having a same value are adjacent each other in the position code and separated by a spacer code.

* * * * *

UNITED STATES PATENT AND TRADEMARK OFFICE
CERTIFICATE OF CORRECTION

| | | |
|---|---|---|
| PATENT NO. | : 7,845,571 B2 | Page 1 of 1 |
| APPLICATION NO. | : 11/425138 | |
| DATED | : December 7, 2010 | |
| INVENTOR(S) | : Monro | |

It is certified that error appears in the above-identified patent and that said Letters Patent is hereby corrected as shown below:

Page 2, item (56), under "Other Publications", in Column 2, Line 57, delete "Volumer" and insert -- vol. --.

Page 3, item (56), under "Other Publications", in Column 2, Line 2, delete "Heirarchical" and insert -- Hierarchical --.

Column 2, lines 27-28, delete "S W:" and insert -- SW: --.

Column 4, line 49, delete "R F:" and insert -- RF: --.

Column 8, line 32, delete "to" and insert -- to: --.

Column 13, line 11, in Claim 25, delete "instructions" and insert -- instructions, --.

Signed and Sealed this

Nineteenth Day of April, 2011

David J. Kappos
*Director of the United States Patent and Trademark Office*